(12) United States Patent
Saiki

(10) Patent No.: US 8,422,240 B2
(45) Date of Patent: Apr. 16, 2013

(54) ELECTRONIC APPARATUS

(75) Inventor: Jun Saiki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/844,294

(22) Filed: Jul. 27, 2010

(65) Prior Publication Data

US 2011/0019382 A1    Jan. 27, 2011

(30) Foreign Application Priority Data

Jul. 27, 2009   (JP) ................................ 2009-174065

(51) Int. Cl.
   *H05K 5/00*   (2006.01)
(52) U.S. Cl.
   USPC .......... 361/752; 361/810; 361/742; 361/758; 361/770; 361/749
(58) Field of Classification Search .............. 361/752, 361/810, 742, 758, 770, 804, 749
   See application file for complete search history.

(56) References Cited

U.S. PATENT DOCUMENTS

| | | | |
|---|---|---|---|
| 4,145,584 A * | 3/1979 | Otterlei ...................... | 200/5 A |
| 4,180,711 A * | 12/1979 | Hirata et al. ................. | 200/5 A |
| 4,303,960 A * | 12/1981 | Sherwood et al. ........... | 361/212 |
| 4,938,703 A * | 7/1990 | Nakano ........................... | 439/74 |
| 5,895,289 A * | 4/1999 | Smith ........................... | 439/553 |
| 6,026,325 A * | 2/2000 | Weinberg et al. .............. | 607/36 |
| 6,172,666 B1 * | 1/2001 | Okura .......................... | 345/168 |
| 6,373,718 B2 * | 4/2002 | Okuda ......................... | 361/814 |
| 2006/0056829 A1 * | 3/2006 | Hirota et al. ................... | 396/54 |
| 2007/0066394 A1 * | 3/2007 | Ikeda et al. .................... | 463/37 |
| 2008/0207283 A1 * | 8/2008 | Zaitsu et al. ................ | 455/575.3 |
| 2009/0005132 A1 * | 1/2009 | Ogatsu ...................... | 455/575.3 |

FOREIGN PATENT DOCUMENTS

| | | |
|---|---|---|
| JP | 2003-132758 | 5/2003 |
| JP | 2005-251551 | 9/2005 |
| JP | 2006-246074 | 9/2006 |
| JP | 2008-243742 | 10/2008 |
| JP | 2009-145760 | 7/2009 |

\* cited by examiner

*Primary Examiner* — Tuan T Dinh
*Assistant Examiner* — Steven Sawyer
(74) *Attorney, Agent, or Firm* — Panasonic Patent Center

(57) ABSTRACT

An electronic apparatus includes a flexible printed circuit having a first surface on which a switch is mounted, a reinforcement plate having a first surface arranged to face a second surface of the flexible printed circuit opposite to the first surface of the flexible printed circuit on which the switch is mounted, and a spacer arranged to face a second surface of the reinforcement plate opposite to the first surface of the reinforcement plate that faces the second surface of the flexible printed circuit.

12 Claims, 6 Drawing Sheets

ELECTRONIC APPARATUS

BACKGROUND

1. Technical Field

The technical field relates to an electronic apparatus, and more particularly, relates to an electronic apparatus having a flexible printed circuit on which a switch for receiving operation of an operation key is implemented.

2. Related Art

For example, JP2006-246074A is a prior art document relating to an electronic apparatus having a flexible printed circuit (FPC) on which a switch for receiving operation of an operation key is mounted. The imaging apparatus disclosed in JP2006-246074A includes an image display unit for displaying an image based on an image signal, a key unit having a plurality of operation keys arranged on the same face as the face on which the image display unit is arranged, a flexible printed circuit extending on the back surface of the key unit arranged with detection switches for detecting operation of the key unit, and a pressing plate which not only holds the image display unit but also backs up the flexible printed circuit.

However, the art disclosed in JP2006-246074A has a problem in that, when the pressing plate is formed by sheet metal processing, a circuit board mounted with electronic components arranged nearly on the side, of the pressing plate, opposite to the side facing the flexible printed circuit would cause electrical malfunction such as short circuit, which is not preferable.

To solve the problem, an electronic apparatus including various kinds of circuit boards on which electronic components are mounted is provided for reinforcing the flexible printed circuit and preventing electric malfunction.

SUMMARY

In one aspect, an electronic apparatus includes a flexible printed circuit having a first surface on which a switch is mounted, a reinforcement plate having a first surface arranged to face a second surface of the flexible printed circuit opposite to the first surface of the flexible printed circuit on which the switch is mounted, and a spacer arranged to face a second surface of the reinforcement plate opposite to the first surface of the reinforcement plate that faces the second surface of the flexible printed circuit.

With the above structure, the flexible printed circuit is received by the reinforcement plate, so that the flexible printed circuit is reinforced. Even when a circuit board is arranged facing the second surface of the reinforcement plate opposite to the first surface of the reinforcement plate facing the second surface of the flexible printed circuit, a gap between the flexible printed circuit and the circuit board can be ensured by arranging the spacer between the reinforcement plate and the circuit board.

The spacer may have a positioning section, and the reinforcement plate and the flexible printed circuit may be positioned with respect to the spacer by the positioning section. Accordingly, the reinforcement plate and the flexible printed circuit can be easily positioned with respect to the spacer.

The flexible printed circuit, the reinforcement plate, and the spacer may be formed as one unit. The integrally formed spacer unit can be easily assembled into the electronic apparatus main body.

The spacer may have a fixing claw, and the reinforcement plate and the flexible printed circuit may be fixed to the spacer by the fixing claw. Accordingly, the spacer, the reinforcement plate, and the flexible printed circuit can be integrated.

According to the aforementioned aspect, the flexible printed circuit is received by the reinforcement plate to reinforce the flexible printed circuit. Further, the spacer ensures the space at the surface opposite to the surface of the reinforcement plate that is opposite to the flexible printed circuit. Accordingly, the main circuit board can be arranged in the space. In other words, the space can be provided surely between the reinforcement metal and the main circuit board, preventing electrical malfunction such as short circuit among electronic components mounted on the reinforcement plate and the main circuit board. Further, the flexible printed circuit, the sheet metal, and the spacer can be made into a unit, which allows the components to be easily assembled into the electronic apparatus main body.

DETAILED DESCRIPTION OF PREFERRED EMBODIMENT

A digital camera according to a preferred embodiment will be explained with reference to the drawings. It should be noted that the digital camera is one example of embodiment of an electronic apparatus.

Figure 1:
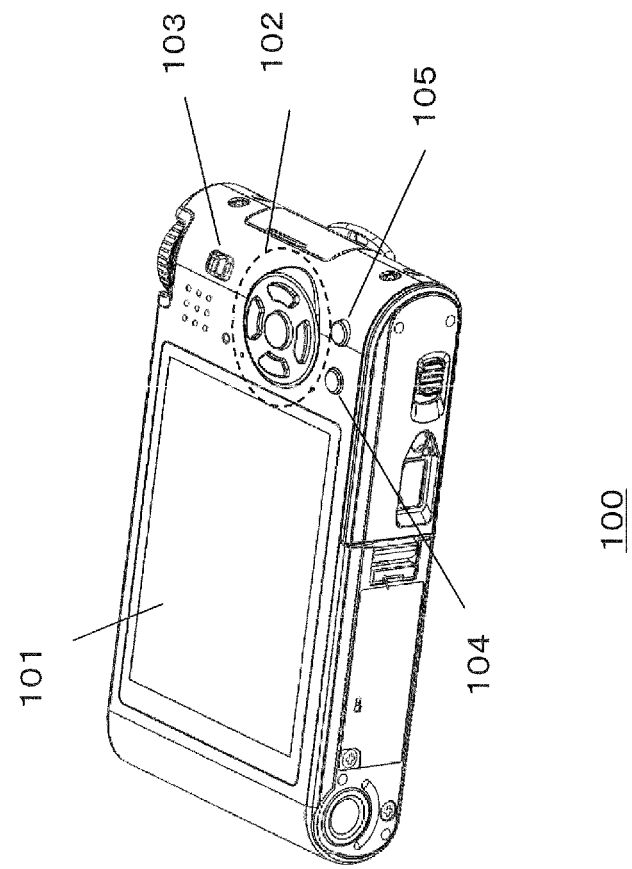
FIG. 1 is a perspective view illustrating a digital camera according to an embodiment when the digital camera is seen from a bottom surface side.

FIG. 1 is a perspective view illustrating a digital camera according to the embodiment when the digital camera is seen from a bottom surface side.

A liquid crystal display monitor 101 is arranged on the back surface of the digital camera 100. The liquid crystal display monitor 101 can display an image of a subject and an image based on captured image data. Operation buttons 102 including arrow buttons and an enter button is arranged on the right side of the liquid crystal display monitor 101. Further, a slide knob 103 is arranged to switch between execution of processing relating to shooting operation of the digital camera 100 and execution of processing for displaying an image based on captured image data on the liquid crystal display monitor 101 to display. Still further, a display button 104 for switching display of the liquid crystal display monitor 101, and a deletion button 105 for deleting unnecessary image data are arranged.

Figure 2:
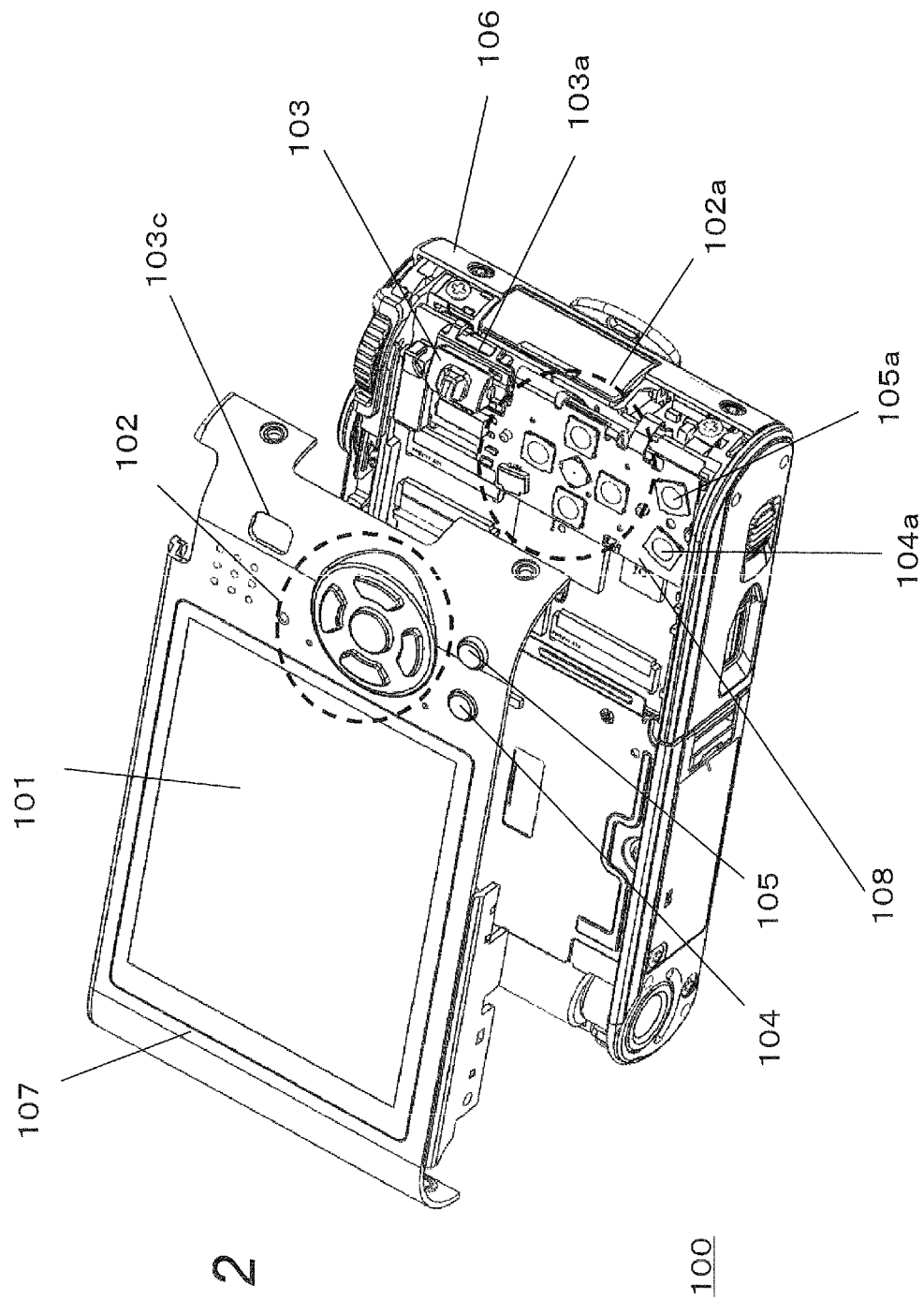
FIG. 2 is a first exploded perspective view illustrating the digital camera according to the embodiment.

FIG. 2 is an exploded perspective view illustrating the digital camera 100 according to the embodiment. In FIG. 2, a rear cover 107 is detached from a front cover 106 having a lens barrel and a circuit board.

The flexible printed circuit 108 is mounted with switches 102a, 104a, and 105a. The operation buttons 102, a display button 104, and a delete button 105 are attached to the rear cover 107. It is so configured that, when each of the operation buttons 102, the display button 104, and the delete button 105 are pressed, the switches 102a, 104a, and 105a mounted on the flexible printed circuit 108 are pressed.

The slide knob 103 is attached to a slide switch 103a mounted on the flexible printed circuit 108. The slide knob 103 is inserted into a hole 103c formed on the rear cover 107. The slide switch 103a can be switched by sliding the slide knob 103.

As described above, when each of the operation buttons 102, the display button 104, and the delete button 105 is pressed, force toward the front cover 106 is exerted on the flexible printed circuit 108 through the switches 102a, 104a, and 105a mounted on the flexible printed circuit 108. Further, when the slide knob 103 is slid, force toward the front cover 106 is exerted on the flexible printed circuit 108 through the slide switch 103a.

Figure 3:
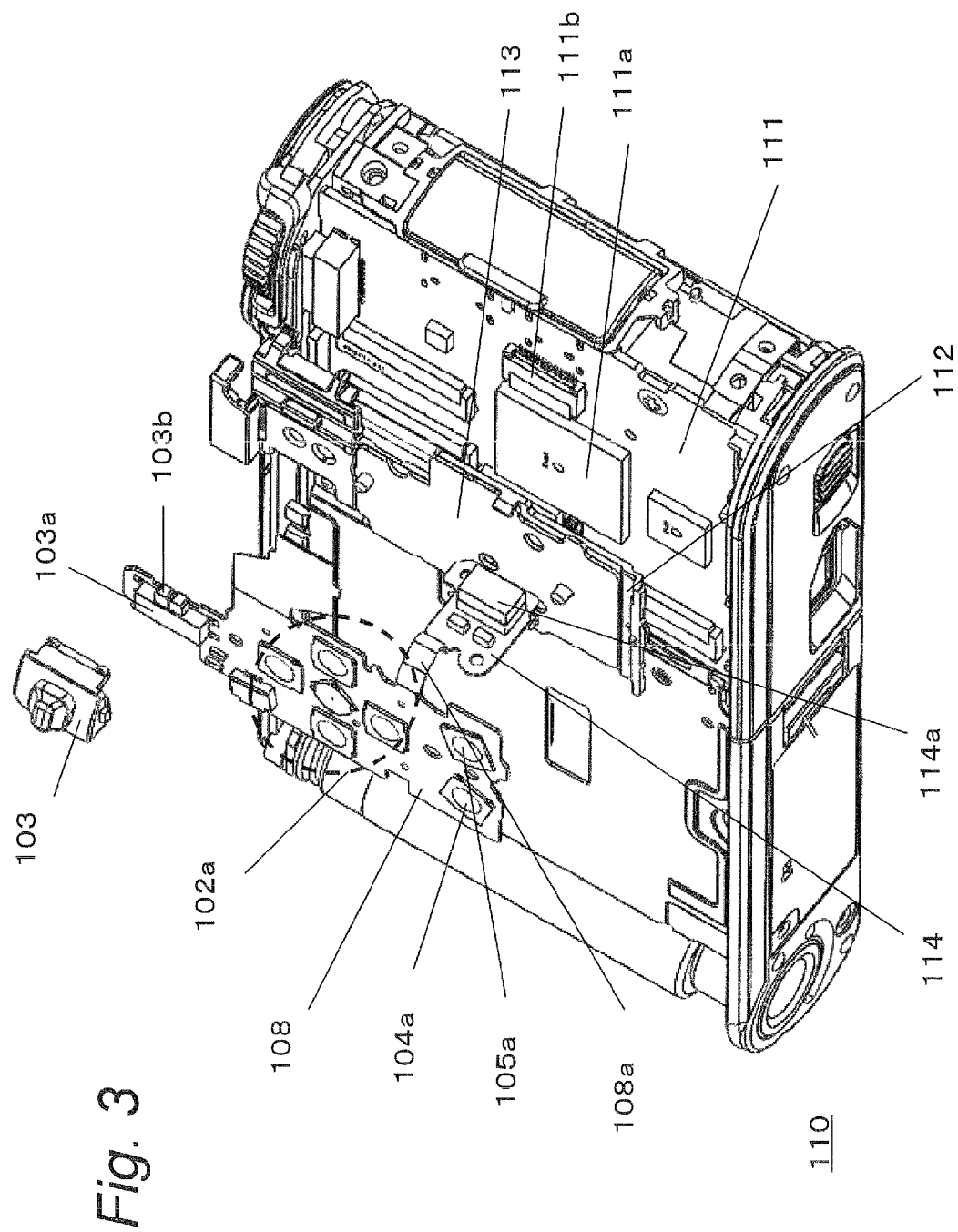
FIG. 3 is an exploded perspective view illustrating a main body section of the digital camera according to the embodiment.

FIG. 3 is an exploded perspective view illustrating a main body section 110 of the digital camera according to the embodiment. In FIG. 3, both of the front cover 106 and the rear cover 107 are detached, and thus they are not shown. A sheet metal 113 is provided to reinforce the flexible printed circuit 108, positioned and fixed on a spacer 112. In FIG. 3, the sheet metal 113 and the spacer 112 which are integrally attached, are detached from the main body section 110. Further, the flexible printed circuit 108 is detached from the spacer 112 integrally formed with the sheet metal 113. The slide knob 103 fits in the slide section 103b of the slide switch 103a. Therefore, by sliding the slide knob 103, the slide section 103b of the slide switch 103a slides. In FIG. 3, the slide knob 103 is also detached.

The flexible printed circuit 108 includes an extension section 108a. An end section of the extension section 108a is connected to a child circuit board 114. The child circuit board 114 is mounted with a gyro sensor 114a for detecting shake applied to the digital camera 100 (i.e., angular acceleration of movement of the digital camera). By providing the flexible printed circuit 108 with the extension section 108a, it becomes easy to electrically connect between the flexible printed circuit 108 and the child circuit board 114 located even at a position that makes it difficult to connect a normal circuit board. The gyro sensor 114a may be mounted on the extension section 108a of the flexible printed circuit 108.

A main board 111 is arranged on the main body section 110 at a position facing the flexible printed circuit 108. The main circuit board 111 is mounted with electronic components such as an LSI 111a, a connector 111b, resistors, capacitors, and the like. The sheet metal 113 reinforcing the flexible printed circuit 108 is made of metal, and the spacer 112 is made of resin. Although the force toward the main circuit board 111 is exerted on the flexible printed circuit 108, the spacer 112 is arranged between the sheet metal 113 and the main circuit board 111, and thus a gap (space) can be maintained between the flexible printed circuit 108 and the main circuit board 111. Therefore, even if the sheet metal 113 is bent when the force toward the main board 111 is exerted on the flexible printed circuit 108, a short circuit does not occur between the sheet metal 113 and the electronic components mounted on the main circuit board 111.

Figure 4:
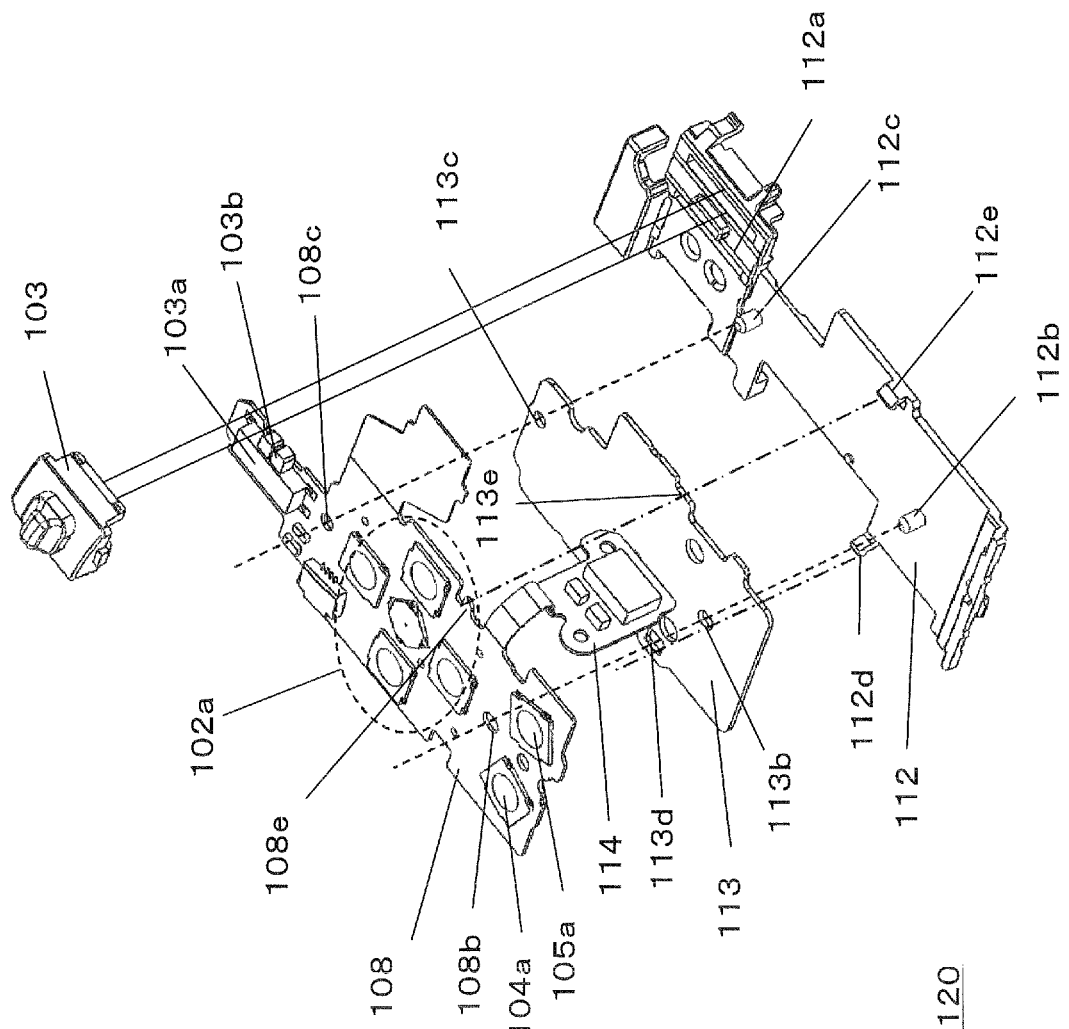
FIG. 4 is an exploded perspective view illustrating a spacer unit.

FIG. 4 is an exploded perspective view illustrating a spacer unit. The spacer unit 120 includes the spacer 112, the sheet metal 113, and the flexible printed circuit 108.

Figure 5B:
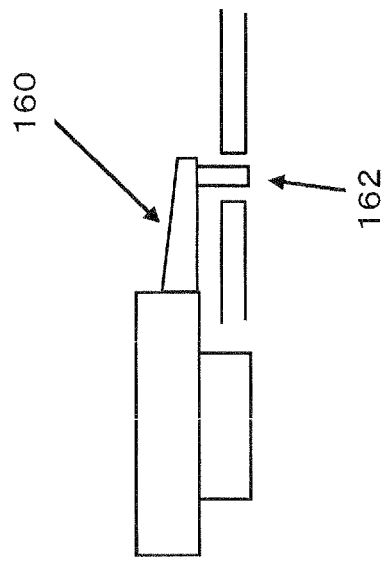
FIG. 5B is a cross section view of a rotary switch with a knob.
Figure 5A:
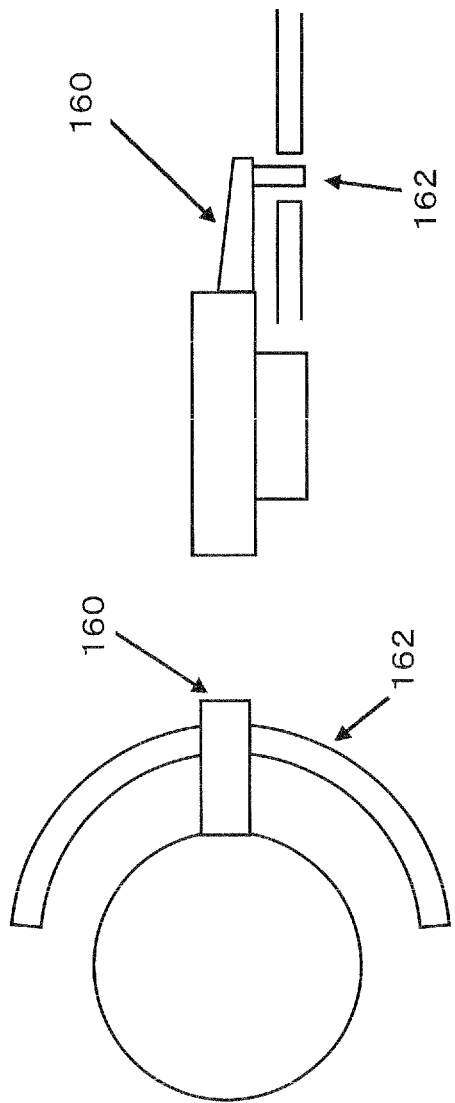
FIG. 5A is a top view of a rotary switch with a knob.

The spacer 112 is provided with a rail 112a which slidably fixes the slide knob 103. In other words, the slide knob 103 fits in the slide section 103b of the slide switch 103a mounted on the flexible printed circuit 108, and is slidably fixed to the rail 112a arranged on the spacer 112. Therefore, the slide knob 103 can smoothly slide. In a case where the flexible printed circuit 108 is arranged with other movable switch (switch that changes its state according to the position of a movable section) instead of the slide switch 103a, guide section may be arranged on the spacer 112 to enable the movable section of the movable switch to move. For example, when a rotary switch with a knob as shown in FIGS. 5A and 5B is provided, a rail (guide section) may be provided along a guide groove for guiding a knob 160.

The spacer 112 is arranged with positioning bosses 112b, 112c. The positioning boss 112b is inserted into a positioning hole 113b formed in the sheet metal 113 and a positioning hole 108b formed in the flexible printed circuit 108. The positioning boss 112c is inserted into a positioning hole 113c formed in the sheet metal 113 and a positioning hole 108c formed in the flexible printed circuit 108. The positioning bosses 112b, and 112c allow the sheet metal 113 and the flexible printed circuit 108 to be easily positioned with respect to the spacer 112. In the present embodiment, the sheet metal 113 and the flexible printed circuit 108 are positioned with respect to the spacer 112 by the positioning bosses 112b, and 112c provided on the spacer 112. However, they may be positioned by those other than the positioning bosses. For example, they may be positioned by a plurality of ribs arranged at an end of the spacer. In a case where a plurality of ribs are used for positioning, it is not necessary to form positioning holes in a sheet metal and a flexible printed circuit, and therefore the cost of the sheet metal and the flexible printed circuit can be reduced.

The spacer 112 is formed with fixing claws 112d, and 112e. The fixing claw 112d is inserted into a fixing hole 113d formed in the sheet metal 113 so as to engage the sheet metal 113 with the spacer 112. The fixing claw 112e engages with a fixing section 113e of the sheet metal 113 and a fixing section 108e of the flexible printed circuit 108. Hereinafter, the reason why the fixing claw 112e is engaged with both of the sheet metal 113 and the flexible printed circuit 108 but the fixing claw 112d is engaged with only the sheet metal 113 will be explained. First, the sheet metal 113 is fixed to the spacer 112 by the fixing claws 112d, and 112e. When the flexible printed circuit 108 is attached in this state, it is necessary to bend the flexible printed circuit 108 in order to engage the flexible printed circuit 108 with both of the fixing claws 112d, 112e. However, since switches 102a, 104a, and 105a are already mounted on the flexible printed circuit 108, excessive bending the flexible printed circuit 108 causes defective solder joint, which is not preferable. In order to avoid the above problem, only the fixing claw 112e is inserted into the flexible printed circuit 108 to engage with the flexible printed circuit 108, thus preventing the flexible printed circuit 108 from bending. Since the flexible printed circuit 108 is light weight, the slide knob 103 is slidably attached to the rail 112a arranged on the spacer 112 via the slide section 103b formed on the slide switch 103a. In other words, the flexible printed circuit 108 is also fixed to the spacer 112 by way of the rail 112a. Therefore, the rail 112a may also be considered as one example of a fixing section.

The spacer unit 120 is completed as described above. Since the spacer 112, the sheet metal 113, the flexible printed circuit 108, and the child circuit board 114 are integrally formed, they can be easily assembled into the digital camera 100, and thus, the number of assembly steps of the digital camera 100 can be reduced.

Figure 6:
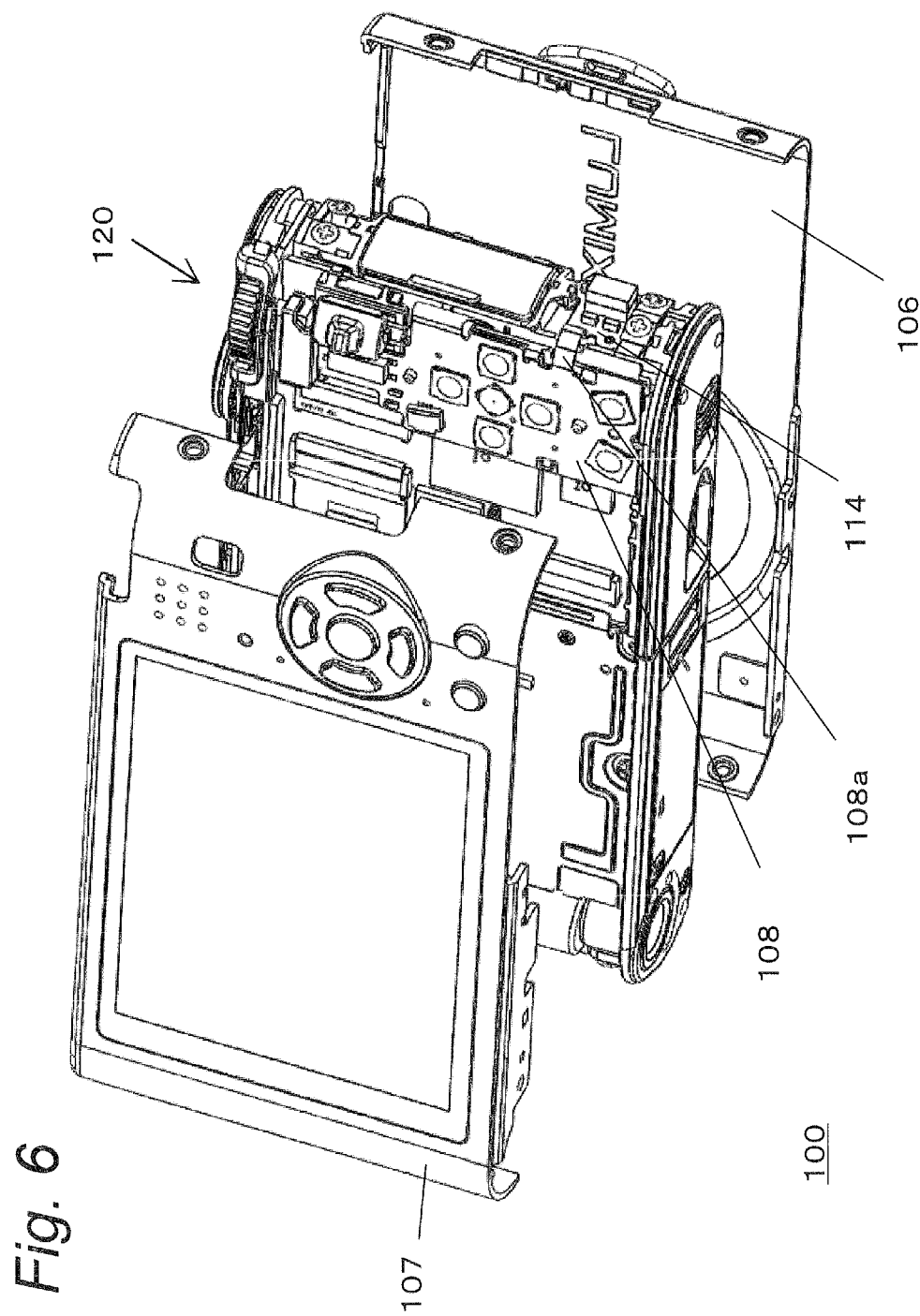
FIG. 6 is a second exploded perspective view illustrating the digital camera according to the embodiment.

FIG. 6 is another exploded perspective view illustrating the digital camera 100 according to the embodiment. The digital camera 100 is structured such that the main body section 120 is covered by the front cover 106 and the rear cover 107. The child circuit board 114 connected to the extension section 108a of the flexible printed circuit 108 is arranged to wrap around the right side surface of the digital camera 100.

As explained as above, according to the present embodiment, the flexible printed circuit 108 is received by the sheet metal (reinforcement plate) 113 result, the flexible printed circuit 108 can be reinforced. Further, the spacer 112 is arranged on a surface opposite to a surface of the sheet metal 113 that faces the flexible printed circuit 108. This arrangement makes a gap (space) on the side of the surface of the sheet metal 113 that faces the flexible printed circuit 108. As a result, the main circuit board 111 can be arranged in the gap (space). In other words, the space can be ensured between the sheet metal 113 and the main circuit board 111, to prevent electrical malfunction such as short circuit among electronic components mounted on the sheet metal 113 and the main circuit board 111. Further, the flexible printed circuit 108, the sheet metal 113, and the spacer 112 can be made into a unit, which allows the above components to be easily assembled into the electronic apparatus main body.

Although only one gyro sensor is provided in the embodiment, a plurality of gyro sensors may be provided. For example, when a gyro sensor capable of detecting an angular velocity in only one direction is used, it is necessary to arrange two gyro sensors for detecting angular velocities in yaw direction and pitch direction, respectively. Detection in pitch direction can be performed by a gyro sensor which is arranged on top plate of the digital camera. In general structure of a digital camera, there is no circuit board in parallel to a lateral face of the digital camera. Therefore, a gyro sensor for detection in yaw direction can not be arranged in the general structure. According to the embodiment, a gyro sensor can be arranged on the child circuit board 114 (or the extension section 108a) which is arranged in parallel to a lateral face of the digital camera so that detection in yaw direction is possible.

INDUSTRIAL APPLICABILITY

According to the embodiment, the flexible printed circuit mounted with the switches can be reinforced, electrical malfunction such as short circuit among electronic components mounted on a reinforcement plate (for example, the sheet metal) and another circuit board can be prevented. Therefore, the embodiment is useful for an electronic apparatus (for example, digital camera) having switches.

What is claimed is:

1. An electronic apparatus comprising:
   a flexible printed circuit having a first surface on which a switch is mounted;
   a reinforcement plate having a first surface arranged to face a second surface of the flexible printed circuit opposite to the first surface of the flexible printed circuit on which the switch is mounted;
   a spacer having a first surface arranged to face a second surface of the reinforcement plate opposite to the first surface of the reinforcement plate that faces the second surface of the flexible printed circuit, the spacer having a plate-like shape and being made of an electrical insulating material;
   a main circuit board arranged to face a second surface of the spacer opposite to the first surface of the spacer; and
   a case configured to store therein the main circuit board, the spacer, the flexible printed circuit and the reinforcement plate, wherein:
   the spacer includes two fixing claws; and
   the flexible printed circuit is fixed to the spacer through the reinforcement plate at only one side of the flexible printed circuit with one of the fixing claws.

2. The electronic apparatus according to claim 1, wherein the spacer has a positioning section, and
   the reinforcement plate and the flexible printed circuit are positioned with respect to the spacer by the positioning section.

3. The electronic apparatus according to claim 1, wherein the flexible printed circuit, the reinforcement plate, and the spacer are formed as one unit.

4. The electronic apparatus according to claim 1, wherein the flexible printed circuit has an extension section which is connected to a second circuit board.

5. The electronic apparatus according to claim 1, wherein the flexible printed circuit has an extension section on which a gyro sensor for detecting movement of the electronic apparatus is mounted.

6. The electronic apparatus according to claim 1, wherein the switch is a movable switch that changes its state according to a position of a movable section, and the spacer has a guiding section that guides the movable section.

7. The electronic apparatus according to claim 1, wherein the reinforcement plate is made of metal.

8. The electronic apparatus according to claim 1, wherein the spacer is entirely provided within, and is independent from, the case.

9. The electronic apparatus according to claim 1, wherein the case includes a front cover and a rear cover, the front cover being attached to the rear cover to therein store the main circuit board, the spacer, the flexible printed circuit and the reinforcement plate.

10. The electronic apparatus according to claim 1, wherein the spacer is made of resin.

11. The electronic apparatus according to claim 3, wherein one of the two fixing claws fixes the reinforcement plate and the flexible printed circuit to the spacer, and the other one of the two fixing claws fixes only the reinforcement plate to the spacer.

12. The electronic apparatus according to claim 4, wherein the second circuit board is mounted with a gyro sensor for detecting movement of the electronic apparatus.

* * * * *